(12) United States Patent
Ding et al.

(10) Patent No.: US 12,016,234 B2
(45) Date of Patent: Jun. 18, 2024

(54) DISPLAY SUBSTRATE, METHOD OF MANUFACTURING DISPLAY SUBSTRATE, AND DISPLAY DEVICE HAVING MONOCHROMATIC FILTER LAYER

(71) Applicants: Chengdu BOE Optoelectronics Technology Co., Ltd., Chengdu (CN); BOE Technology Group Co., Ltd., Beijing (CN)

(72) Inventors: Xiaoqi Ding, Beijing (CN); Jie Li, Beijing (CN); Jiali Wang, Beijing (CN); Xinlei Yang, Beijing (CN); Guoyi Cui, Beijing (CN); Ke Liu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 454 days.

(21) Appl. No.: 17/429,032

(22) PCT Filed: Oct. 30, 2020

(86) PCT No.: PCT/CN2020/125441
§ 371 (c)(1),
(2) Date: Aug. 6, 2021

(87) PCT Pub. No.: WO2022/088083
PCT Pub. Date: May 5, 2022

(65) Prior Publication Data
US 2022/0302217 A1   Sep. 22, 2022

(51) Int. Cl.
*H10K 59/38* (2023.01)
*H10K 50/86* (2023.01)
(Continued)

(52) U.S. Cl.
CPC .......... *H10K 59/38* (2023.02); *H10K 50/865* (2023.02); *H10K 71/00* (2023.02); *H10K 59/12* (2023.02); *H10K 59/1201* (2023.02)

(58) Field of Classification Search
CPC ..... H10K 59/38; H10K 50/865; G02F 1/1335
See application file for complete search history.

(56) References Cited

U.S. PATENT DOCUMENTS 10,146,081 B2   12/2018   Park et al.
10,763,312 B2    9/2020   Jo et al.
(Continued)

FOREIGN PATENT DOCUMENTS

CN   1609637 A    4/2005
CN   106019694 A  10/2016
(Continued)

*Primary Examiner* — Nduka E Ojeh
(74) *Attorney, Agent, or Firm* — Westman, Champlin & Koehler, P.A.

(57) ABSTRACT

The present disclosure provides a display substrate, a method of manufacturing a display substrate, and a display device. The display substrate includes: a base substrate; a color filter layer arranged on the base substrate, wherein the color filter layer includes a plurality of sub-color filters; and a monochromatic filter layer arranged on a side of the color filter layer away from the base substrate, wherein the monochromatic filter layer is formed as a filter layer with a fourth primary color, one of the first primary color, the second primary color and the third primary color is the same as the fourth primary color, or the first primary color, the second primary color, the third primary color and the fourth primary color are different from each other.

12 Claims, 10 Drawing Sheets

(51) Int. Cl.
*H10K 59/12* (2023.01)
*H10K 71/00* (2023.01)

(56) References Cited

U.S. PATENT DOCUMENTS

| | | | |
|---|---|---|---|
| 10,770,515 | B2 | 9/2020 | Kim et al. |
| 10,847,586 | B2 | 11/2020 | Lee |
| 2005/0083452 | A1 | 4/2005 | Rho |
| 2016/0025302 | A1 | 1/2016 | Shiratori |
| 2017/0146855 | A1 | 5/2017 | Park et al. |
| 2018/0182814 | A1 | 6/2018 | Kim et al. |
| 2018/0182819 | A1 | 6/2018 | Jo et al. |
| 2018/0197922 | A1* | 7/2018 | Song .................... H10K 50/805 |
| 2020/0111856 | A1 | 4/2020 | Lee |
| 2020/0194502 | A1* | 6/2020 | Joo ........................ H10K 50/86 |
| 2020/0357858 | A1 | 11/2020 | Jo et al. |
| 2021/0193953 | A1 | 6/2021 | Liu et al. |
| 2021/0359006 | A1* | 11/2021 | Sun ........................ H10K 59/40 |
| 2023/0413636 | A1* | 12/2023 | Lee ........................ H10K 59/38 |

FOREIGN PATENT DOCUMENTS

| | | |
|---|---|---|
| CN | 106842674 A | 6/2017 |
| CN | 108231829 A | 6/2018 |
| CN | 108242456 A | 7/2018 |
| CN | 108922913 A | 11/2018 |
| CN | 109923675 A | 6/2019 |
| CN | 110034167 A | 7/2019 |
| CN | 110164934 A | 8/2019 |
| CN | 110379832 A | 10/2019 |
| CN | 111009560 A | 4/2020 |
| CN | 111240078 A | 6/2020 |

\* cited by examiner

DISPLAY SUBSTRATE, METHOD OF MANUFACTURING DISPLAY SUBSTRATE, AND DISPLAY DEVICE HAVING MONOCHROMATIC FILTER LAYER

CROSS REFERENCE TO RELATED APPLICATION(S)

This application is a Section 371 National Stage Application of International Application No. PCT/CN2020/125441, filed on Oct. 30, 2020, the contents of which are incorporated herein by reference in its entirety.

TECHNICAL FIELD

The present disclosure relates to a field of display technology, and in particular to a display substrate, a method of manufacturing a display substrate, and a display device.

BACKGROUND

Color filter on Encapsulation (COE) refers to a color filter (CF) made on an encapsulation cover plate or an encapsulation layer of a Thin Film Encapsulation (TFE), which replaces a polarizer (Pol) to achieve an anti-reflection function. Replacement of the polarizer with the color filter may also realize a flexibility of an Organic Light Emitting Diode (OLED) display device and reduce a power consumption of the OLED display device.

Current COE structure generally includes a black matrix layer (BM), and red, green and blue color filter layers (RGB color filter layers). The COE structure may be patterned by semiconductor processes such as glue coating, exposure and development, so as to manufacture the BM and the RGB color filter layers. However, in the process of manufacturing the BM, there are problems such as BM peeling, BM remain, and difficulty in BM exposure alignment.

SUMMARY

In view of this, embodiments of the present disclosure provide a display substrate, a method of manufacturing a display substrate, and a display device, which may improve BM peeling, BM remain, and difficulty in BM exposure alignment.

The embodiments of the present disclosure provide a display substrate, including: a base substrate; a color filter layer arranged on the base substrate, wherein the color filter layer includes a plurality of sub-color filters including at least a first primary color sub-color filter, a second primary color sub-color filter and a third primary color sub-color filter, the first primary color, the second primary color and the third primary color are different from each other; and a monochromatic filter layer arranged on a side of the color filter layer away from the base substrate, wherein the monochromatic filter layer is formed as a filter layer with a fourth primary color, one of the first primary color, the second primary color and the third primary color is the same as the fourth primary color, or the first primary color, the second primary color, the third primary color and the fourth primary color are different from each other, and wherein at least one of an orthographic projection of the first primary color sub-color filter on the base substrate, an orthographic projection of the second primary color sub-color filter on the base substrate and an orthographic projection of the third primary color sub-color filter on the base substrate at least partially overlaps an orthographic projection of the monochromatic filter layer on the base substrate.

In some embodiments, the fourth primary color is the same as the first primary color.

In some embodiments, each of the orthographic projection of the second primary color sub-color filter on the base substrate and the orthographic projection of the third primary color sub-color filter on the base substrate at least partially overlaps the orthographic projection of the monochromatic filter layer on the base substrate.

In some embodiments, the monochromatic filter layer includes a first opening exposing a part of the second primary color sub-color filter and a second opening exposing a part of the third primary color sub-color filter; and an orthographic projection of the first opening on the base substrate has an area greater than that of an orthographic projection of the second opening on the base substrate.

In some embodiments, the orthographic projection of the first primary color sub-color filter on the base substrate at least partially overlaps the orthographic projection of the monochromatic filter layer on the base substrate; or an orthographic projection of an overlapping region of the first primary color sub-color filter and the monochromatic filter layer on the base substrate has an area less than or equal to that of the orthographic projection of the first primary color sub-color filter on the base substrate; or the orthographic projection of the first primary color sub-color filter on the base substrate does not overlap the orthographic projection of the monochromatic filter layer on the base substrate.

In some embodiments, the first primary color is red, the second primary color is green, and the third primary color is blue.

In some embodiments, orthographic projections of two at least partially adjacent sub-color filters of the plurality of sub-color filters on the base substrate at least partially overlap each other.

In some embodiments, the display substrate further includes: a driving circuit layer arranged on the base substrate; a light emitting device arranged on a side of the driving circuit layer away from the base substrate; and an encapsulation layer arranged on a side of the light emitting device away from the base substrate, wherein the color filter layer is arranged on a surface of the encapsulation layer away from the base substrate.

In some embodiments, the display substrate further includes at least one of: a first cover layer arranged between the color filter layer and the monochromatic filter layer; and a second cover layer arranged on a side of the monochromatic filter layer away from the base substrate.

In some embodiments, the display substrate further includes: a metal light-shielding layer arranged on the side of the monochromatic filter layer away from the base substrate, wherein at least one of the orthographic projection of the first primary color sub-color filter on the base substrate, the orthographic projection of the second primary color sub-color filter on the base substrate and the orthographic projection of the third primary color sub-color filter on the base substrate at least partially overlaps the orthographic projection of the monochromatic filter layer on the base substrate so as to form an overlapping region on the base substrate, and an orthographic projection of the metal light-shielding layer on the base substrate is at least partially located in the overlapping region; and wherein an orthographic projection of the second cover layer on the base substrate does not overlap the orthographic projection of the metal light-shielding layer on the base substrate.

In some embodiments, the metal light-shielding layer includes at least one of a metal light-absorbing layer or a metal light-reflecting layer.

The embodiments of the present disclosure further provide a method of manufacturing a display substrate, including: forming a base substrate; forming a color filter layer on the base substrate, wherein the color filter layer includes a plurality of sub-color filters including at least a first primary color sub-color filter, a second primary color sub-color filter and a third primary color sub-color filter, the first primary color, the second primary color and the third primary color are different from each other; and forming a monochromatic filter layer on a side of the color filter layer away from the base substrate, wherein the monochromatic filter layer is formed as a filter layer with a fourth primary color, one of the first primary color, the second primary color and the third primary color is the same as the fourth primary color, or the first primary color, the second primary color, the third primary color and the fourth primary color are different from each other, and wherein at least one of an orthographic projection of the first primary color sub-color filter on the base substrate, an orthographic projection of the second primary color sub-color filter on the base substrate and an orthographic projection of the third primary color sub-color filter on the base substrate at least partially overlaps an orthographic projection of the monochromatic filter layer on the base substrate.

In some embodiments, the method further includes: forming a first cover layer on the color filter layer subsequent to forming the color filter layer on the base substrate, wherein the monochromatic filter layer is formed on the first over layer; and/or forming a second cover layer on the monochromatic filter layer subsequent to forming the monochromatic filter layer on the color filter layer; and/or adjusting an opening rate of at least part of the plurality of sub-color filters by adjusting an opening rate of the monochromatic filter layer.

In some embodiments, the method further includes: forming a first photoresist layer on the monochromatic filter layer; forming a concave region at a pattern on the first photoresist layer based on a mask reticle with the pattern; forming a metal light-shielding layer on the first photoresist layer including the concave region; forming a second photoresist layer on the metal light-shielding layer, wherein the first photoresist layer has a photosensitivity opposite to that of the second photoresist layer; forming a mask with the pattern on the second photoresist layer based on the mask reticle; and forming a metal light-shielding layer with the pattern by using the mask.

The embodiments of the present disclosure further provide a display device, including the display substrate described above.

Advantages of additional aspects of the present disclosure will be partially given in the following description, and some may become obvious from the following description or may be understood through the practice of the present disclosure.

BRIEF DESCRIPTION OF THE DRAWINGS

In order to more clearly explain the technical solutions in the embodiments of the present disclosure, the drawings of the embodiments will be briefly introduced below. It should be noted that the drawings in the following description are only some embodiments of the present disclosure, and are not intended to limit the present disclosure.

DETAILED DESCRIPTION OF EMBODIMENTS

Figure 1:
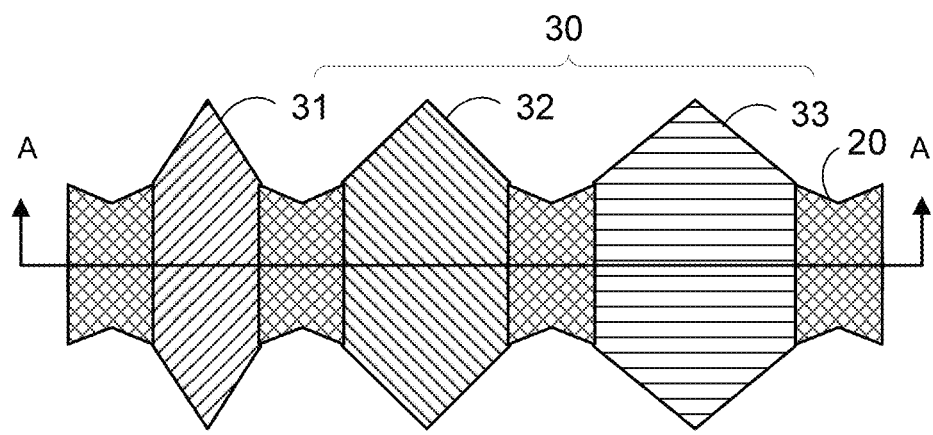
FIG. 1 shows a plan view of a display substrate.

In order to make the objectives, technical solutions and advantages of the present disclosure more apparent, the embodiments of the present disclosure will be described below with reference to the drawings. It should be understood that the following description of the embodiments is intended to explain and illustrate a general idea of the present disclosure, and should not be construed as limiting the present disclosure. In the description and the drawings, the same or similar reference numerals indicate the same or similar components or members. For clarity, the drawings are not necessarily drawn in proportion, and some known components and structures may be omitted in the drawings.

Unless otherwise defined, technical terms or scientific terms used in the present disclosure shall be of the general meaning understood by the ordinary skilled in the art. The words "first," "second," and the like used in the present disclosure do not denote any order, quantity or importance, but are used to distinguish different components. The words "comprising," "including" and the like indicate that the element or item preceding the word contains the elements or items listed following the word as well as the equivalents, but do not exclude other elements or items. The words "connected," "coupled," or the like are not limited to physical or mechanical connections, but may include electrical connections, whether direct or indirect. The words "upper", "lower", "left", "right", "top" or "bottom" and the like are only used to indicate relative positional relationship, and when the absolute position of the object described is changed, the relative positional relationship may also correspondingly changed. When an element such as a layer, a film, an area or a substrate is referred to be located "above" or "below" another element, the element may be "directly" located "above" or "below" the other element, or there may be an intermediate element.

In order to facilitate the understanding of the technical solutions of the present disclosure, a display substrate, problems existing in the display substrate, and causes of the problems will be described firstly.

FIG. 1 shows a plan view of a display substrate.

As shown in FIG. 1, the display substrate using a COE process may generally include a BM 20 and a RGB color filter layer 30. The RGB color filter layer 30 may include a first primary color sub-color filter 31 (such as a red sub-color filter), a second primary color sub-color filter 32 (such as a green sub-color filter), and a third primary color sub-color filter 33 (such as a blue sub-color filter). The BM 20 may be arranged between any two adjacent sub-color filters, such as between adjacent red sub-color filter and green sub-color filter. For a GGRB pixel structure design, the BM 20 may be arranged between two adjacent green sub-color filters. It should be noted that the red sub-color filter is a sub-color filter through which red light may pass, that is, user's eyes may see the red light from the red sub-color filter. The sub-color filters of different colors may have the same or different shapes. For example, the red sub-color filter has a smallest size, the blue sub-color filter has a largest size, and the green sub-color filter has a size between that of the red sub-color filter and that of the blue sub-color filter.

Figure 2:
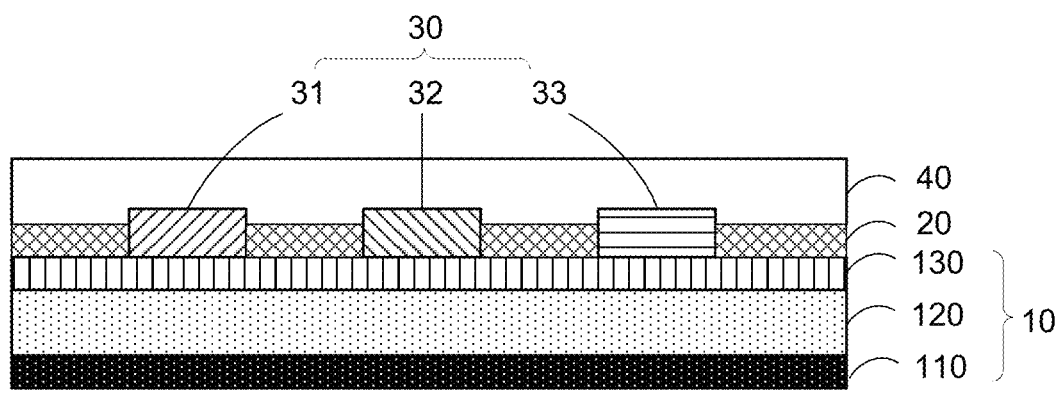
FIG. 2 shows a schematic cross-sectional view of the display substrate in FIG. 1 taken along line A-A.

FIG. 2 shows a schematic cross-sectional view of the display substrate in FIG. 1 taken along line A-A.

As shown in FIG. 2, the display substrate further includes a base substrate 10. The BM 20 and the color filter layer 30 are located on the base substrate 10 and spaced apart from each other. In addition, the BM 20 and the color filter layer 30 may be covered with a first cover layer 40 that separates the BM 20 and the color filter layer 30 from an external environment so as to provide protection for the BM 20 and the color filter layer 30.

The base substrate 10 may include a driving circuit layer 110 arranged on the base substrate, and a light emitting element 120 located on the driving circuit layer 110. For example, the light emitting element 120 may include a first electrode layer located on the driving circuit layer 110, an electroluminescent layer located on the first electrode layer, and a second electrode layer located on the electroluminescent layer. For example, the electroluminescent layer may be formed by a three-dimensional INK-Jet Printing (IJP) process. The first electrode layer and the second electrode layer may be formed by processes such as chemical vapor deposition (CVD), physical vapor deposition (PVD), and the like. In addition, an encapsulation layer 130 is further provided on the second electrode layer, so as to form the color filter layer 30 and the like on the encapsulation layer 130.

The driving circuit layer 110 may include a substrate, a plurality of gate lines arranged on the substrate, and a plurality of data lines arranged on the substrate. Each gate line extends in a first direction, and each data line extends in a second direction. For example, the first direction may be perpendicular to the second direction. The plurality of gate lines and the plurality of data lines respectively cross to form a plurality of sub-pixel units arranged in an array on the substrate. Each sub-color filter corresponds to a sub-pixel unit.

In an embodiment, the light emitting element 120 includes a first electrode, an electroluminescent layer and a second electrode that are sequentially away from the substrate and stacked in this order. An OLED device is illustrated below by way of example in describing the light emitting element 120. The first electrode may be, for example, an anode electrode, which may be made of an opaque metal material, or may be made of a transparent conductive material, such as ITO, ZnO, etc. In some embodiments, the anode electrode is made as a metal electrode. Since the metal material has good electrical conductivity and high reflectivity, a voltage applied to the anode electrode may be accurately controlled, and the anode electrode may reflect incident light to improve a light extraction efficiency, so that the light emitting element 120 may exhibit a good display effect and the energy consumption may be reduced. The electroluminescent layer may be, for example, an organic light emitting layer, which may include a hole injection layer (HIL), a hole transport layer (HTL), an electron blocking layer (EBL), a light emitting layer (EML), a hole blocking layer (HBL), an electron transport layer (ETL), and an electron injection layer (EIL). The electroluminescent layer may emit light, for example, red, green or blue monochromatic light, or for another example, white light, when a voltage is applied. The second electrode may be, for example, a cathode electrode, which may be made of a transparent conductive material, such as ITO, ZnO, IZTO, etc.

The inventor conducted research and analysis on the problems of BM peeling, BM remain, and difficulty in BM exposure alignment, and found that the reasons may be as follows. The current COE process generally includes patterning the BM and the RGB color filters through processes such as glue coating, exposure and development. Because the BM is a negative adhesive, a serious undercut phenomenon may occur during the process, and it is easy to cause peeling of the filter layer.

Figure 3:
FIG. 3 shows a schematic diagram of undercut after BM patterning.

FIG. 3 shows a schematic diagram of undercut after BM patterning.

As shown in FIG. 3, the BM located on the base substrate 10 may have a serious undercut phenomenon during the process, so that the BM 20 presents an inverted trapezoid shape. The inverted trapezoid shape may reduce a contact area between the BM 20 and the base substrate 10, resulting in a decrease in an adhesion of the BM 20, so that the BM 20 may easily fall off from the base substrate 10.

In addition, carbon black may be used as a colorant of existing BM materials. The carbon black and resin have strong physical adsorption and chemical bonding capabilities, so the BM materials and organic carbon (OC) tend to form strong forces, which may cause the BM remain. Furthermore, because black absorbs light, there is difficulty in alignment during BM exposure.

Therefore, if a structure may be found to replace the BM, at least part of the above problems may be effectively mitigated.

In addition, the inventor further analyzed a color shift problem in the display substrate in a related art at a large viewing angle. The size of the R/G/B color filters is usually designed according to a pixel opening structure, so the sizes of the R/G/B color filters are not consistent.

After an in-depth research, the inventor found that this may lead to different luminance decay angles (L-decay) for different colors. For example, for the design of the GGRB pixel structure, red R L-decay<green G L-decay<blue B L-decay. In a case of the large viewing angle, due to the different L-Decay of RGB light, a color shift at the large viewing angle may be caused. Specifically, since R L-decay<G L-decay<B L-decay, that is, the luminance decay angle of blue light is greater than that of green light, and the luminance decay angle of green light is greater than that of red light, a decay degree of red light at the large viewing angle is the most serious, while a decay degree of blue light and a decay degree of green light are relatively slight compared with that of red light. Blue light and green light are mixed to produce cyan light.

Figure 4:
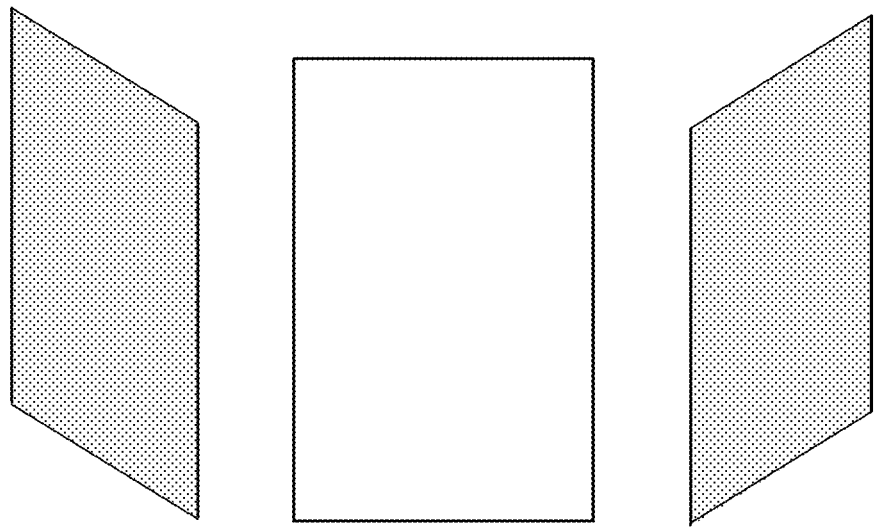
FIG. 4 shows a schematic diagram of the display substrate turning cyan at a large viewing angle.

FIG. 4 shows a schematic diagram of the display substrate turning cyan at a large viewing angle.

A middle figure in FIG. 4 shows a normal display effect without a color shift. As shown in a left figure and a right figure in FIG. 4, when an angle between a connection direction of the display substrate with the user's eyes and a plane where the display substrate is located becomes smaller, display of the display substrate turns cyan, causing a cyan display at the large viewing angle, which affects the display effect.

The structure of the display substrate and a method of manufacturing the display substrate according to the embodiments of the present disclosure will be exemplarily described below with reference to FIG. 5 to FIG. 23.

Figure 5:
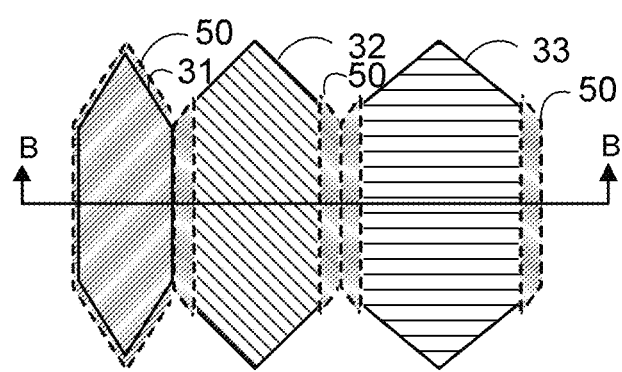
FIG. 5 shows a plan view of a display substrate provided by an embodiment of the present disclosure.
Figure 6:
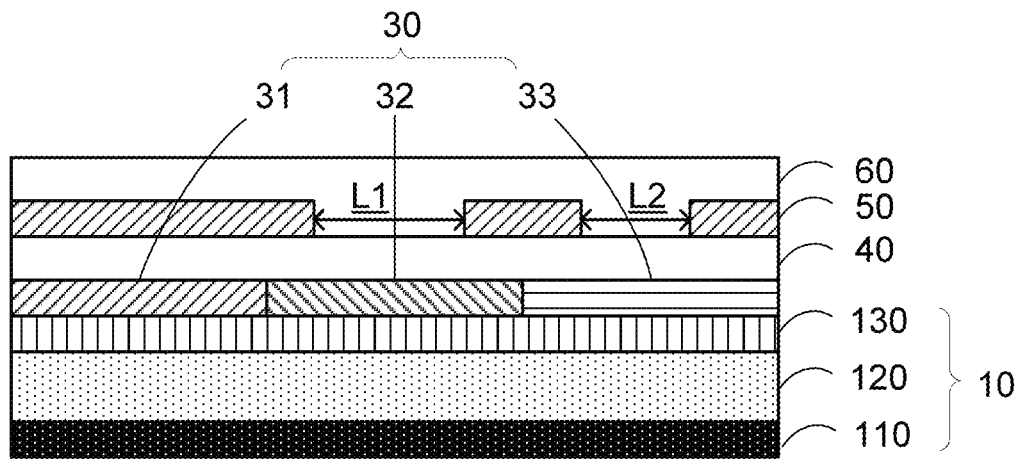
FIG. 6 shows a schematic cross-sectional view of the display substrate in FIG. 5 taken along line B-B.

FIG. 5 shows a plan view of a display substrate provided by an embodiment of the present disclosure. FIG. 6 shows a schematic cross-sectional view of the display substrate in FIG. 5 taken along line B-B.

As shown in FIG. 5 and FIG. 6, the display substrate may include a base substrate 10, a color filter layer 30 arranged on the base substrate, and a monochromatic filter layer 50 arranged on a side of the color filter layer 30 away from the base substrate. The color filter layer 30 may include a plurality of sub-color filters including at least a first primary color sub-color filter 31, a second primary color sub-color filter 32 and a third primary color sub-color filter 33, and the first primary color, the second primary color and the third primary color are different from each other. The monochromatic filter layer 50 is formed as a filter layer with a fourth primary color. One of the first primary color, the second primary color and the third primary color is the same as the fourth primary color, or the first primary color, the second primary color, the third primary color and the fourth primary color are different from each other. At least one of an orthographic projection of the first primary color sub-color filter 31 on the base substrate, an orthographic projection of the second primary color sub-color filter 32 on the base substrate and an orthographic projection of the third primary color sub-color filter 33 on the base substrate at least partially overlaps an orthographic projection of the monochromatic filter layer 50 on the base substrate.

In an embodiment, the color filter layer 30 is arranged on the base substrate 10, and the color filter layer 30 includes a plurality of sub-color filers each corresponding to one of three primary colors. The monochromatic filter layer 50 is arranged on the color filter layer 30, and has an overlapping region with at least part of the plurality of sub-color filters. The overlapping region includes regions of at least two colors as a light-shielding region in an overlapping direction.

With the combined use of the monochromatic filter layer 50 and the color filter layer 30, the color filter thickness may be increased, and the BM size may be reduced by cooperating with the structure equivalent to BM described above, or even the BM may be replaced. In addition, the color of the monochromatic filter layer 50 is adjustable, so that a color of emitted light and a color of reflected light against external natural light may be adjusted by adjusting the color of the monochromatic filter layer, so as to adjust the display effect.

In an embodiment, the fourth primary color is the same as the first primary color. For example, the first primary color is red, the second primary color is green, and the third primary color is blue.

The color of the monochromatic filter layer may be one of the three primary colors. For example, the color of the monochromatic filter layer may be red, green or blue. In this way, the monochromatic filter layer 50 may completely cover the sub-color filter with the consistent color. For example, a red monochromatic filter layer may completely cover the red sub-color filter, and further cover a partial region of the green sub-color filter and the blue sub-color filter (this partial region forms the structure equivalent to BM described above). This may maximize the color filter thickness (an equivalent thickness of the color filter layer 30 and the monochromatic filter layer 50, such as an average value of a total thickness of the color filter layer 30 and the monochromatic filter layer 50 at each position), which helps reduce the reflectivity of the external natural light and improve the cyan display at the large viewing angle.

In an embodiments, each of the orthographic projection of the second primary color sub-color filter 32 on the base substrate and the orthographic projection of the third primary color sub-color filter 33 on the base substrate at least partially overlaps the orthographic projection of the monochromatic filter layer on the base substrate.

It should be noted that in FIG. 5 and FIG. 6, the monochromatic filter layer 50 has an overlapping region with each of the sub-color filters of the color filter layer 30. However, it is not excluded that there is no overlapping region between the monochromatic filter layer 50 and some sub-color filters of the color filter layer 30. For example, the monochromatic filter layer 50 is a red filter layer, which may or may not have an overlapping region with the red sub-color filter in the color filter layer 30.

In an embodiment, a coverage rate of the plurality of sub-color filters with respect to the base substrate is greater than or equal to a preset coverage rate. The preset coverage rate may be for a display area of the display substrate, or may be for a surface area of the entire display substrate. For example, the coverage rate of the plurality of sub-color filters with respect to the display area may reach 100%. This may help reduce the BM size, which effectively reduces the reflectivity of the external natural light and helps mitigate the cyan display at a large viewing angle.

Figure 7:
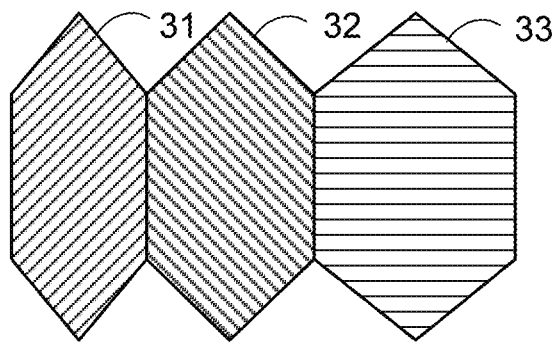
FIG. 7 shows a plan view of a color filter layer provided by an embodiment of the present disclosure.

FIG. 7 shows a plan view of a color filter layer provided by an embodiment of the present disclosure.

As shown in FIG. 7, the color filter layer 30 may include a plurality of sub-color filters of different colors, and adjacent sub-color filters may be attached to each other. For example, the color filter layer 30 may include a red sub-color filter, a green sub-color filter and a blue sub-color filter arranged in sequence. FIG. 7 only shows an arrangement of three sub-color filters, and the display substrate may include more sub-color filters. The arrangement of the plurality of sub-color filters may be, for example, RGB, GGRB, and so on. When the sub-color filter is hexagonal, the plurality of sub-color filters may be arranged in a shape similar to a honeycomb on a plane. An increase in the coverage area of the color filter layer 30 may help to reduce the reflectivity of external natural light.

For example, the three primary colors may be red, green, and blue. The red sub-color filter, the green sub-color filter and the blue sub-color filter may have the same or different sizes, which is determined based on a size of the respective pixels. The overlapping region may include sub-color filters of at least two colors in an overlapping direction, so as to cooperate to form a light-shielding region. Specifically, the red sub-color filter, the green sub-color filter and the blue sub-color filter are arranged in an array, and each of the red sub-color filter, the green sub-color filter and the blue sub-color filter corresponds to a light emitting element. The sub-color filters occupy an area substantially equal to an area of the display area of the display substrate.

Figure 8:
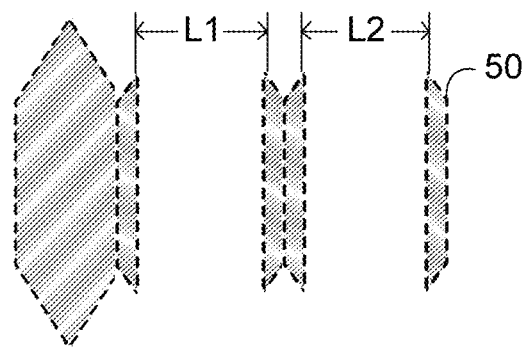
FIG. 8 shows a plan view of a monochromatic filter layer provided by an embodiment of the present disclosure.

FIG. 8 shows a plan view of a monochromatic filter layer provided by an embodiment of the present disclosure.

As shown in FIG. 8, the monochromatic filter layer 50 may include a plurality of filter regions connected to or separated from each other. On the one hand, the monochromatic filter layer 50 may form a light-shielding region together with the sub-color filters of different colors so as to reduce the BM size or replace the BM, which helps reduce the risk of BM peeling, mitigate the problem of BM remain, and help to reduce the difficulty of lithography alignment. On the other hand, the monochromatic filter layer 50 may increase the color filter thickness so as to mitigate the display effect degradation caused by the cyan display at the large viewing angle or excessively high reflectivity of the external natural light. In addition, a process of preparing the monochromatic filter layer 50 is simpler than a process of preparing the multi-color filter layer. For example, only one patterning is required.

Figure 9:
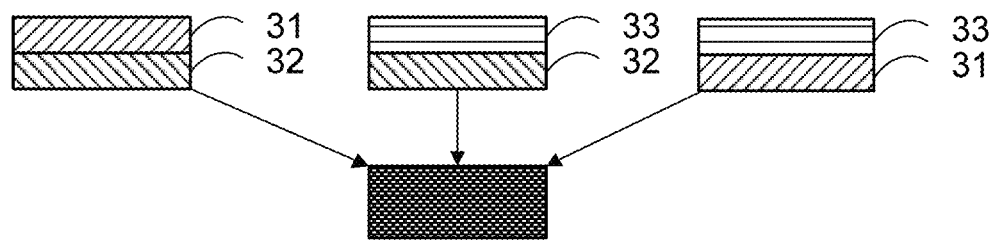
FIG. 9 shows a schematic diagram of a laminate of sub-color filters of different colors equivalent to BM provided by an embodiment of the present disclosure.
Figure 10:
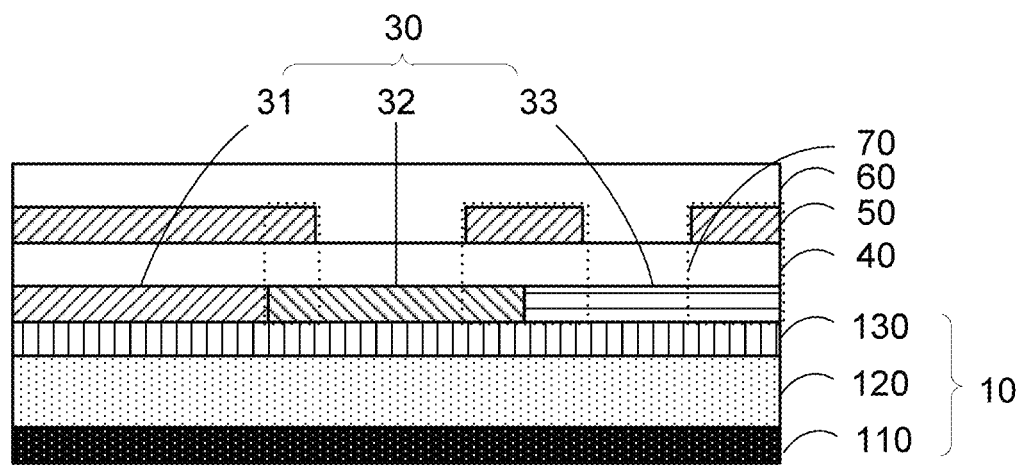
FIG. 10 shows a schematic diagram of the structure equivalent to BM of the display substrate in FIG. 5 taken along line B-B.

FIG. 9 shows a schematic diagram of a laminate of sub-color filters of different colors equivalent to BM provided by an embodiment of the present disclosure. FIG. 10 shows a schematic diagram of the structure equivalent to BM of the display substrate in FIG. 5 taken along line B-B.

As shown in FIG. 9 and FIG. 10, the red sub-color filter and the green sub-color filter cooperate to form a structure 70 equivalent to BM. The red sub-color filter and the blue sub-color filter cooperate to form a structure 70 equivalent to BM. Experimental results show that the two structures 70 equivalent to BM have substantially the same light-shielding effect. Further, the green sub-color filter and the blue sub-color filter may also cooperate to form a structure 70 equivalent to BM. In addition, the red sub-color filter, the green sub-color filter and the blue sub-color filter may also cooperate to form a structure 70 equivalent to BM, which have a better light-shielding effect.

In an embodiment, the monochromatic filter layer 50 includes a first opening exposing a part of the second primary color sub-color filter 32 and a second opening exposing a part of the third primary color sub-color filter 33. An orthographic projection of the first opening on the base substrate 10 has an area greater than that of an orthographic projection of the second opening on the base substrate 10.

Specifically, in order to improve the display effect, the monochromatic film layer 50 has different opening sizes for the sub-color filters of different colors. For example, the monochromatic filter layer 50 has different opening sizes for the red sub-color filter, the green sub-color filter and the blue sub-color filter, so that it is convenient to adjust the display effect of the display substrate by adjusting each opening size.

Referring to FIG. 6, in a direction along the line B-B, a first opening size L1 of the monochromatic filter layer for the green sub-color filter is greater than a second opening size L2 of the monochromatic filter layer for the blue sub-color filter. This may ensure user's visual effect.

In an embodiment, the orthographic projection of the first primary color sub-color filter 31 on the base substrate 10 at least partially overlaps the orthographic projection of the monochromatic filter layer 50 on the base substrate 10; or an orthographic projection of an overlapping region of the first primary color sub-color filter 31 and the monochromatic filter layer 50 on the base substrate 10 has an area less than or equal to that of the orthographic projection of the first primary color sub-color filter 31 on the base substrate 10; or the orthographic projection of the first primary color sub-color filter 31 on the base substrate 10 does not overlap the orthographic projection of the monochromatic filter layer 50 on the base substrate 10.

For example, the monochromatic filter layer 50 is a red filter layer, and an opening rate of the red filter layer for the red sub-color filter may be 0% to 100%. For example, the red filter layer may not cover the red sub-color filter, the red filter layer may cover part of the red sub-color filter or cover a partial region of the red sub-color filter, and the red filter layer may also completely cover the red sub-color filter. It should be noted that the monochromatic filter layer 50 may be implemented by only one photolithography, instead of three times of photolithography as the color filter layer 30, which reduces the manufacturing cost and period.

In an embodiment, the display substrate may further include at least one of: a first cover layer 40 arranged between the color filter layer 30 and the monochromatic filter layer 50; and a second cover layer 60 arranged on a side of the monochromatic filter layer 50 away from the base substrate 10. The first cover layer 40 and the second cover layer 60 may be made of the same or different materials. The first cover layer 40 and the second cover layer 60 may be made of organic materials or inorganic materials, etc., which may achieve functions such as planarization, isolation from the external environment, and protection of the color filters. For example, the first cover layer 40 may be a photoresist formed on the color filter layer 30 by means such as spin coating, so as to make the surface smoother and help improve the production yield of the display substrate because preparing the device structure on a flat surface has a better effect than preparing the device structure on an uneven surface.

The principle that this solution may effectively mitigate the cyan display at the large viewing angle and reduce the reflectivity of the external natural light will be exemplified below.

Figure 11:
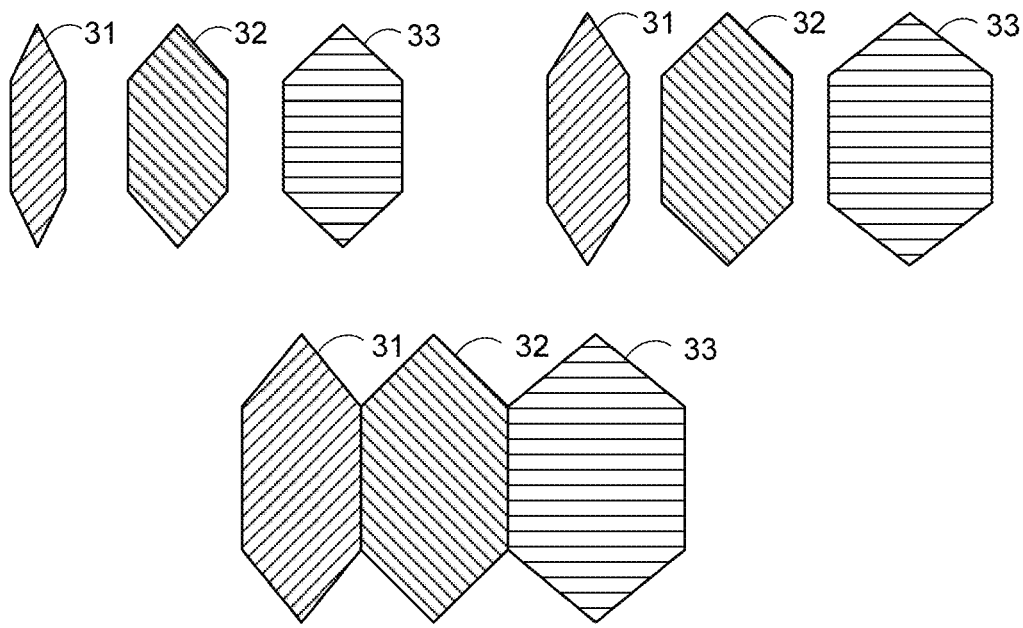
FIG. 11 shows a schematic diagram of an increasing coverage rate of the sub-color filters of the color filter layer provided by an embodiment of the present disclosure.
Figure 12:
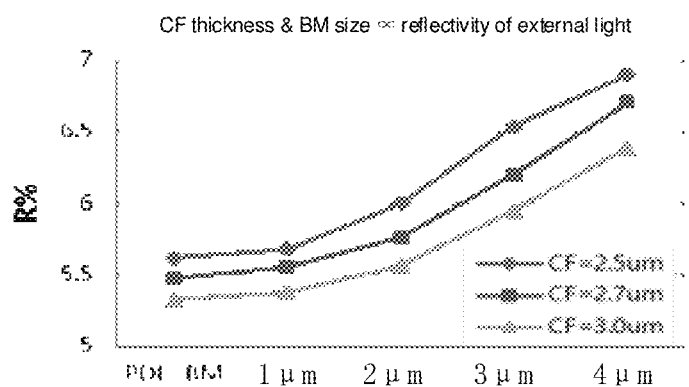
FIG. 12 shows a schematic diagram of a correspondence between a BM size, a color filter thickness and a reflectivity.
Figure 13:
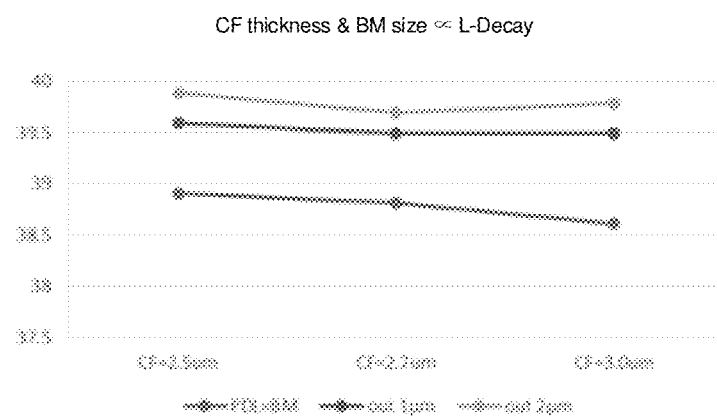
FIG. 13 shows a schematic diagram of a correspondence between a BM size, a color filter thickness and a luminance decay angle.

FIG. 11 shows a schematic diagram of an increasing coverage rate of the sub-color filters in the color filter layer provided by an embodiment of the present disclosure. FIG. 12 shows a schematic diagram of a correspondence between the BM size, the color filter thickness and the reflectivity. FIG. 13 shows a schematic diagram of a correspondence between the BM size, the color filter thickness and the luminance decay angle.

As shown in FIG. 11, in the upper left figure, the red sub-color filter, the green sub-color filter and the blue sub-color filter have a low coverage rate and may be isolated from each other by the BM. In the upper right figure of FIG. 11, the coverage rate of the sub-color filters increases compared with that in the upper left figure of FIG. 11, but adjacent sub-color filters are still isolated from each other by the BM. In the lower figure of FIG. 11, adjacent red sub-color filter, green sub-color filter and blue sub-color filter are abutted from each other, and there is no BM for isolation. FIG. 12 and FIG. 13 show test results for three plane layouts of the color filters in FIG. 11.

As shown in FIG. 12, a horizontal ordinate represents the BM size, and a longitudinal coordinate represents the reflectivity of the external natural light. As shown in FIG. 12, as the BM size increases, that is, as the coverage rate of the sub-color filters decreases, the reflectivity of the external natural light gradually increases. PDL=BM represents a case that there is only the structure equivalent to BM. In addition, as shown in FIG. 12, as the color filter thickness (CF thickness) increases (from 2.5 microns to 3.0 microns in FIG. 12), the reflectivity of the external natural light gradually decreases. That is, experiments (or simulation, etc.) show that the reflectivity of the external natural light decreases as the color filter thickness increases, and the reflectivity of the external natural light increases as the BM size increases. Therefore, it is possible to reduce the reflectivity of the external natural light by increasing the color filter thickness and reducing the BM size.

As shown in FIG. 13, a horizontal ordinate represents the color filter thickness, and a longitudinal coordinate represents L-Decay. As shown in FIG. 13, as the BM size increases, that is, as the coverage rate of the sub-color filters decreases, the L-Decay gradually increases. PDL=BM represents a case that there is only the structure equivalent to BM, out 1 μm represents that the BM size is 1 μm, and out 2 μm represents that the BM size is 2 μm. In addition, as shown in FIG. 12, as the color filter thickness (CF thickness) increases (from 2.5 microns to 3.0 microns in FIG. 12), L-Decay has a decreasing trend. That is, experiments show that L-Decay decreases as the color filter thickness increases, and L-Decay increases as the BM size increases. Therefore, it is possible to reduce the L-Decay by increasing the color filter thickness and reducing the BM size.

It should be noted that the display color tends to be cyan at the large viewing angle, and the reflected light of the monochromatic filter layer 50 in a case of red color against the external natural light contains a high proportion of red light, which may be mixed with the cyan light to make the color turn white, so that the problem of cyan display at the large viewing angle may be further mitigated.

In an embodiment, the COE structure design includes preparing an RGB color filter layer with a total opening rate of 100% after the EN encapsulation is completed, then applying the first cover layer, and then applying a monochromatic filter layer of red color, so as to reduce the reflectivity by a superposition of the large-area color filter layer and the monochromatic filter layer. In addition, the red/green/blue (R/G/B) L-decay may be mitigated by controlling the opening of the monochromatic filter layer in the blue/green (B/G) pixel, so that the monochromatic filter layer of red color has a largest opening at a position of the red sub-color filter, a smaller opening at a position of the green sub-color filter, and a smallest opening at a position of the blue sub-color filter, so that the R/G/B L-decay may be substantially the same finally, thereby reducing the color shift. In addition, since the superposition of the G/B sub-color filters and the monochromatic filter layer of red color is equivalent to the BM, the BM process is not required, so that the problems such as Alignment, Remain and Peeling caused by the BM process may be avoided.

In the display substrate provided by the embodiment of the present disclosure, the introduction of the monochromatic filter layer may effectively reduce the opening of the BM, and may further increase the color filter thickness. Therefore, the reflectivity of the external natural light may be effectively reduced, and the problem of cyan display at large viewing angle may be effectively mitigated.

Figure 14:
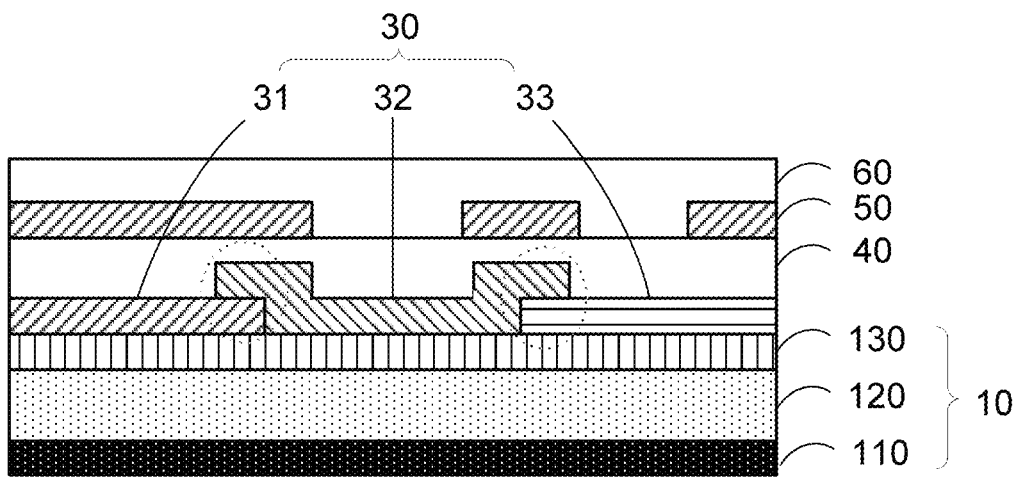
FIG. 14 shows another schematic cross-sectional view of the display substrate in FIG. 5 taken along line B-B.

FIG. 14 shows another schematic cross-sectional view of the display substrate in FIG. 5 taken along line B-B.

Different from FIG. 6, adjacent sub-color filters in FIG. 14 have an overlapping region, such as a region framed by a dashed line in FIG. 14, which may further increase the light-shielding effect of the structure equivalent to BM. For example, the structure equivalent to BM may be formed by the red sub-color filter, the green sub-color filter and the blue sub-color filter. It should be noted that this solution may further increase the size of a single sub-color filter to increase its contact surface area, which helps increase its adhesion and reduce a probability of peeling of the single sub-color filer.

Figure 15:
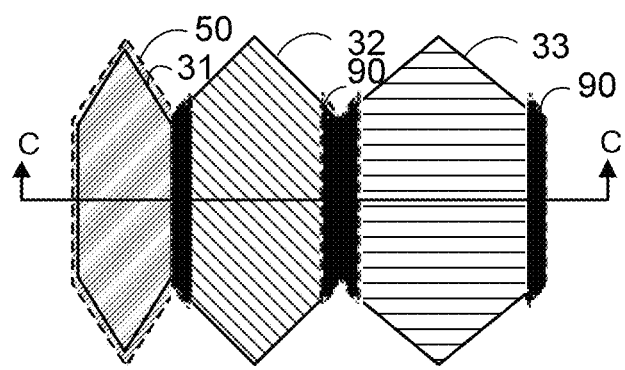
FIG. 15 shows a plan view of a display substrate provided by another embodiment of the present disclosure.
Figure 16:
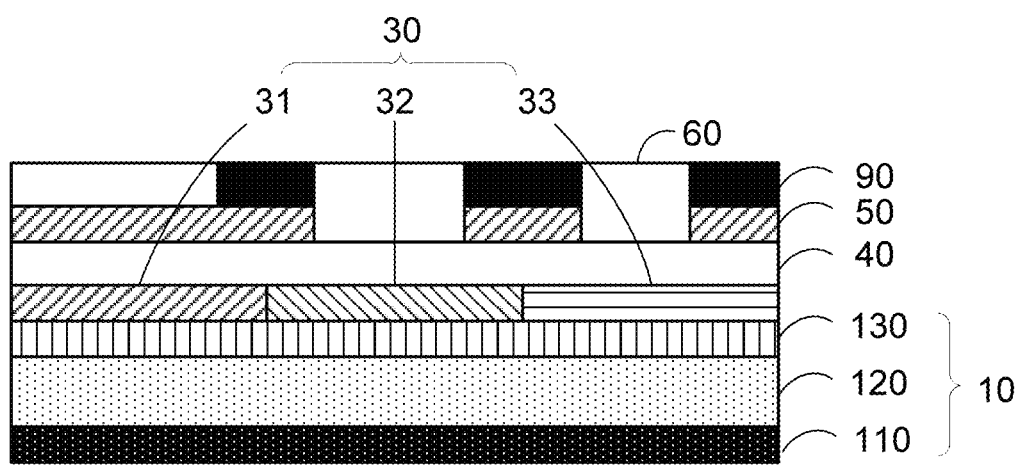
FIG. 16 shows a schematic cross-sectional view of the display substrate in FIG. 15 taken along line C-C.

FIG. 15 shows a plan view of a display substrate provided by another embodiment of the present disclosure. FIG. 16 shows a schematic cross-sectional view of the display substrate in FIG. 15 taken along line C-C.

As shown in FIG. 15 and FIG. 16, the display substrate may further include a metal light-shielding layer 90 stacked on the light-shielding region. Accordingly, the second cover layer 60 is arranged in a region outside the metal light-shielding layer 90.

For example, the display substrate may further include the metal light-shielding layer 90 and the second cover layer 60. The metal light-shielding layer 90 is arranged on a side of the monochromatic filter layer 50 away from the base substrate 10. At least one of the orthographic projection of the first primary color sub-color filter 31 on the base substrate 10, the orthographic projection of the second primary color sub-color filter 32 on the base substrate 10 and the orthographic projection of the third primary color sub-color filter 33 on the base substrate 10 at least partially overlaps the orthographic projection of the monochromatic filter layer 50 on the base substrate 10, so as to form an overlapping region on the base substrate 10. An orthographic projection of the metal light-shielding layer 90 on the base substrate 10 is at least partially located in the overlapping region. An orthographic projection of the second cover layer 60 on the base substrate 10 does not overlap the orthographic projection of the metal light-shielding layer 90 on the base substrate 10.

In an embodiment, the metal light-shielding layer 90 includes at least one of a metal light-absorbing layer or a metal light-reflecting layer.

For example, the metal light-shielding layer 90 may be made of a metal-containing light-absorbing material, or may be a metal light-reflecting material. For example, the metal light-shielding layer 90 may be black molybdenum trioxide (MoO3) arranged on the light-shielding region. For example, the metal light-shielding layer 90 may also be a stacked layer of titanium/aluminum/titanium (Ti/Al/Ti) to form a mirror structure. In the stacked layer of Ti/Al/Ti, a first layer of Ti may increase the adhesion of the mirror structure and hinder Al diffusion or oxidation by the monochromatic filter layer, a second layer of Al may be used as a light-reflecting layer, and a third layer of Ti may block Al from the external environment to reduce the probability of oxidization of Al and provide mechanical protection. In addition, the third layer of Ti may have a large thickness to reduce the reflectivity of Al to the external natural light.

In the display substrate provided by the embodiment of the present disclosure, an RGB color filter with a total opening rate of 100% is prepared after the EN encapsulation is completed, so that the reflectivity may be reduced by the superposition of the large-area color filters and the monochromatic filter layer. By controlling the opening of the monochromatic filter layer in the B/G sub-color filters, the R/G/B L-decays may be improved, so that the R/G/B L-decays are substantially the same, thereby reducing the color shift. In addition, the superposition of the sub-color filters of different colors may be equivalent to the BM, and the BM process is not required, which may avoid the problems of alignment difficulties, BM remain, and BM peeling caused by the BM process.

Another aspect of the present disclosure provides a method of manufacturing a display substrate.

Figure 17:
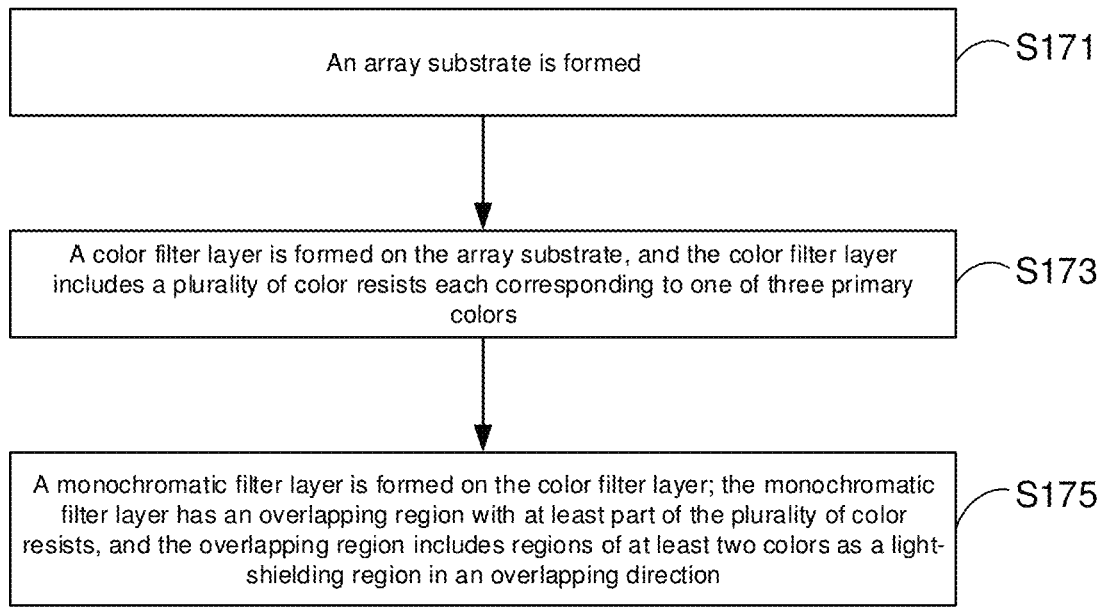
FIG. 17 shows a flowchart of a method of manufacturing a display substrate according to an embodiment of the present disclosure.
Figure 18:
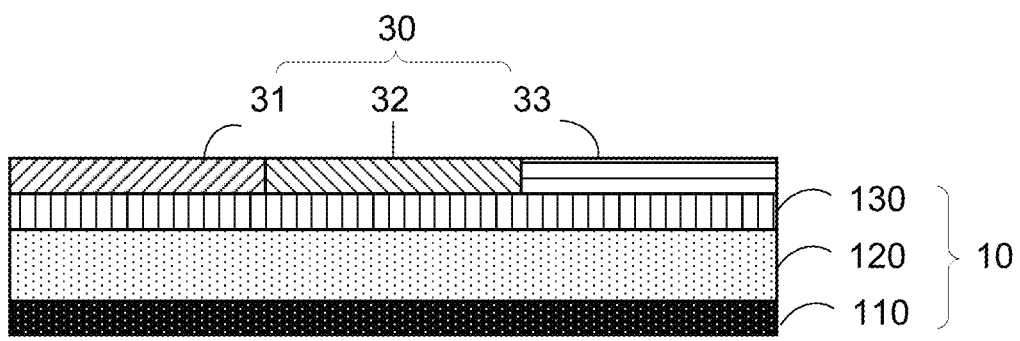
FIG. 18 to FIG. 20 show schematic diagrams of a process of manufacturing a display substrate provided by an embodiment of the present disclosure.
Figure 19:
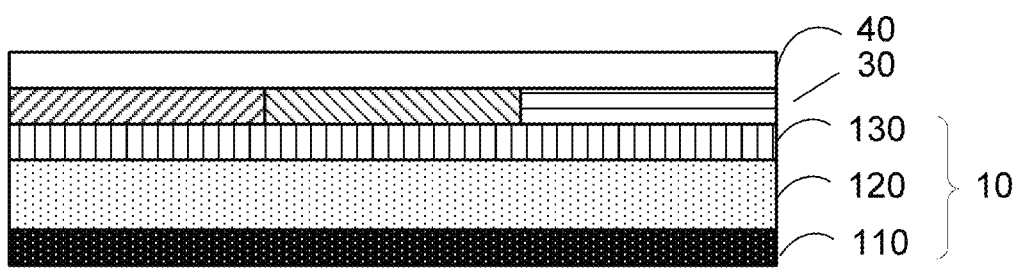
Figure 20:
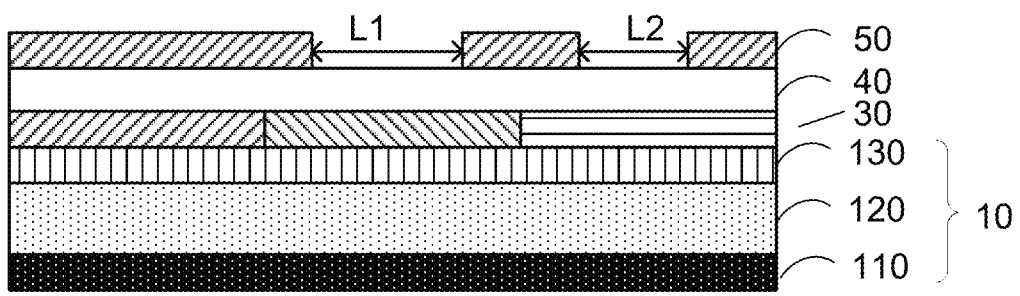

FIG. 17 shows a flowchart of a method of manufacturing a display substrate according to an embodiment of the present disclosure. FIG. 18 to FIG. 20 show schematic diagrams of a process of manufacturing a display substrate provided by an embodiment of the present disclosure.

As shown in FIG. 17, the method of manufacturing the display substrate may include operation S171 to operation S175.

In operation S171, a base substrate is formed.

In operation S173, a color filter layer is formed on the base substrate. The color filter layer includes a plurality of sub-color filters including at least a first primary color sub-color filter 31, a second primary color sub-color filter 32 and a third primary color sub-color filter 33, and the first primary color, the second primary color and the third primary color are different from each other.

In operation S175, a monochromatic filter layer is formed on a side of the color filter layer away from the base substrate. The monochromatic filter layer is formed as a filter layer with a fourth primary color. One of the first primary color, the second primary color and the third primary color is the same as the fourth primary color, or the first primary color, the second primary color, the third primary color and the fourth primary color are different from each other. At least one of an orthographic projection of the first primary color sub-color filter 31 on the base substrate, an orthographic projection of the second primary color sub-color filter 32 on the base substrate and an orthographic projection of the third primary color sub-color filter 33 on the base substrate at least partially overlaps an orthographic projection of the monochromatic filter layer on the base substrate.

For example, the base substrate is formed firstly. Then, a plurality of sub-color filters are formed on the base substrate, and each of the plurality of sub-color filters corresponds to one of three primary colors. Next, the monochromatic filter layer is formed on the color filter layer. The monochromatic filter layer has an overlapping region with at least part of the plurality of sub-color filters. The overlapping region includes regions of at least two colors as a light-shielding region in an overlapping direction.

As shown in FIG. 18, a color filter layer 30 is formed on the base substrate 10. The color filter layer 30 may include a red sub-color filter, a green sub-color filter and a blue sub-color filter. The sub-color filters of the same color may be patterned based on one photolithography process. For example, the preparation of the color filter layer 30 includes three photolithography processes. For example, after the EN encapsulation is completed, the sub-color filter of any color of the RGB color filters is coated, and a mask is used to expose a pattern of the corresponding region. The same is applied to the sub-color filters of the other two colors. Then, the total opening rate of the RGB color filters is 100%.

In an embodiment, the method may further include at least one of following operations.

For example, a first cover layer is formed on the color filter layer after the color filter layer is formed on the base substrate. The monochromatic filter layer is formed on the first over layer;

For another example, a second cover layer is formed on the monochromatic filter layer after the monochromatic filter layer is formed on the color filter layer;

For another example, the opening rate of at least part of the plurality of sub-color filters may be adjusted by adjusting the opening rate of the monochromatic filter layer. Specifically, the opening rate of the monochromatic filter may be adjusted by adjusting a pattern of a mask reticle for the monochromatic filter layer.

As shown in FIG. 19 and FIG. 20, the monochromatic filter layer 50 may be formed on the color filter layer 30. In addition, prior to manufacturing the monochromatic filter layer 50, the first cover layer 40 may be formed on the color filter layer 30 to improve a flatness of the substrate surface. Then, the monochromatic filter layer 50 is formed on the first cover layer 40.

For example, as shown in FIG. 19, the first cover layer 40 is applied. As shown in FIG. 20, the monochromatic filter layer 50 is then applied, and the pattern of the corresponding region is made with a mask exposure so that the largest opening is formed at the red sub-color filter, the smaller opening is formed at the green sub-color filter, and the smallest opening is formed at the blue sub-color filter. The superposition of the G/B color filters and the monochromatic filter layer 50 is equivalent to the BM to replace the traditional BM.

It should be noted that, after the monochromatic filter layer 50 is formed, another cover layer may be formed on the monochromatic filter layer 50 to protect the color filters and planarize the substrate surface.

Figure 21:
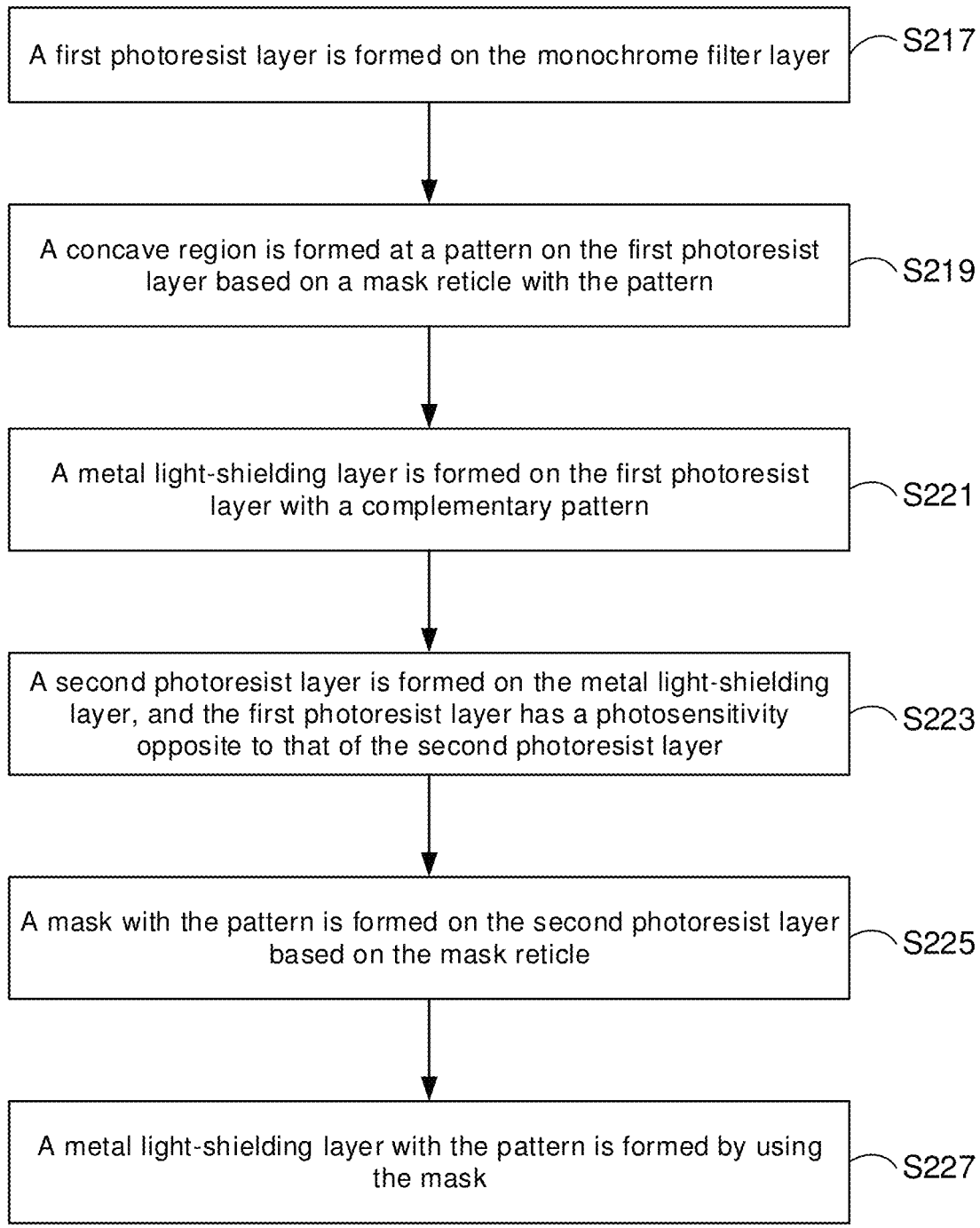
FIG. 21 shows a flowchart of a method of manufacturing a display substrate according to another embodiment of the present disclosure.
Figure 22:
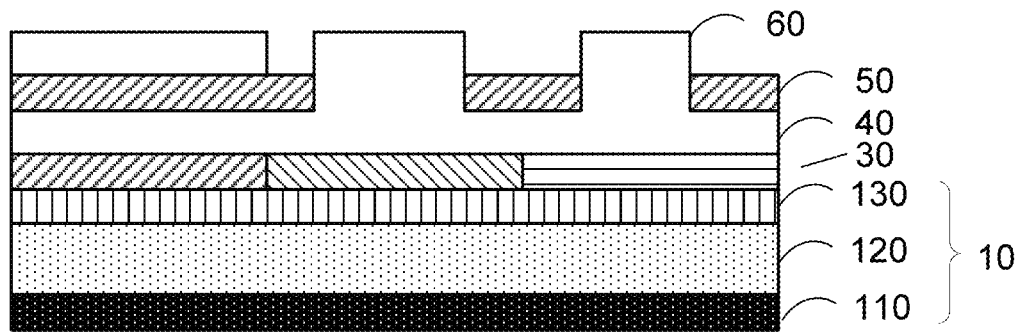
FIG. 22 to FIG. 23 show schematic diagrams of a process of manufacturing a display substrate provided by another embodiment of the present disclosure.
Figure 23:
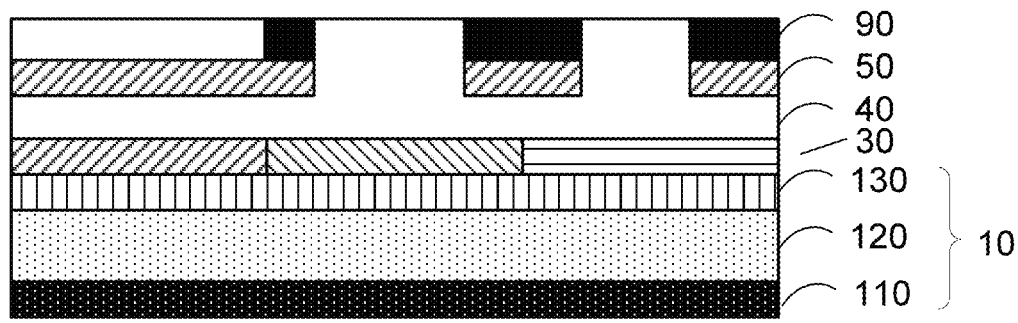

FIG. 21 shows a flowchart of a method of manufacturing a display substrate according to another embodiment of the present disclosure. FIG. 22 to FIG. 23 show schematic diagrams of a process of manufacturing a display substrate provided by another embodiment of the present disclosure.

As shown in FIG. 21, the method of manufacturing the display substrate may further include operation S217 to operation S227.

In operation S217, a first photoresist layer is formed on the monochromatic filter layer.

In operation S219, a concave region is formed at a pattern on the first photoresist layer based on a mask reticle with the pattern.

In operation S221, a metal light-shielding layer is formed on the first photoresist layer including the concave region.

In operation S223, a second photoresist layer is formed on the metal light-shielding layer. The first photoresist layer has a photosensitivity opposite to that of the second photoresist layer.

In operation S225, a mask with the pattern is formed on the second photoresist layer based on the mask reticle.

In operation S227, a metal light-shielding layer with the pattern is formed by using the mask.

In this embodiment, the same mask reticle and two photoresists with opposite photosensitivity are used to complete the patterning of the second cover layer 60 and the patterning of the metal light-shielding layer 90. Specifically, a negative glue structure is firstly prepared by using the mask reticle, then a metal layer is deposited, and then the metal layer is lithographed and etched by using the mask reticle and positive glue. In this way, the above structure may be achieved by using one mask, and more consistent image may be formed.

Another aspect of the present disclosure provides a display device.

Figure 24:
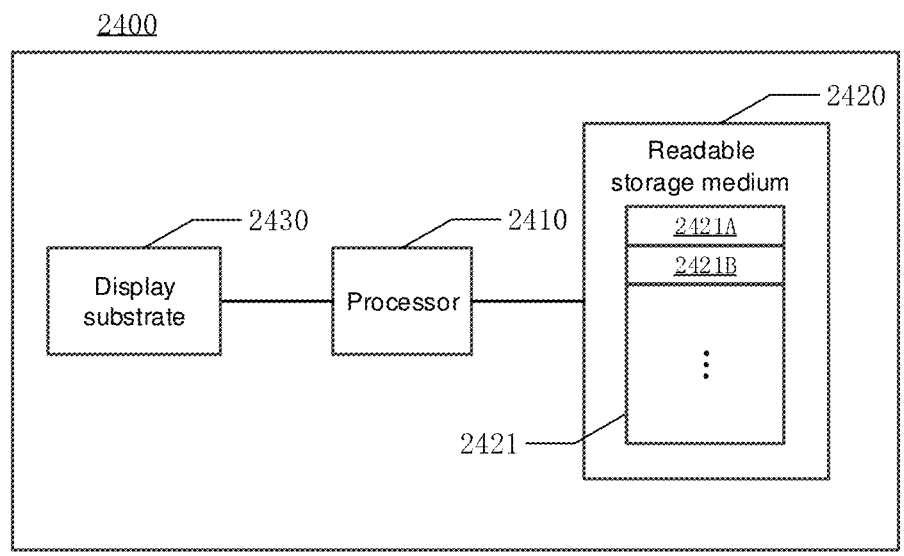
FIG. 24 shows a schematic structural diagram of a display device provided by an embodiment of the present disclosure.

FIG. 24 shows a schematic structural diagram of a display device provided by an embodiment of the present disclosure. As shown in FIG. 24, the display device 2400 includes a display substrate 2430 shown above.

For example, the display device 2400 may include one or more processors 2410, a computer-readable storage medium 2430, and the display substrate 2430.

Specifically, the processor 2410 may include, for example, a general-purpose microprocessor, an instruction set processor and/or a related chipset and/or a special-purpose microprocessor (for example, an application specific integrated circuit (ASIC)), and the like. The processor 2410 may further include an on-board memory for caching purposes.

The computer-readable storage medium 2420, for example, may be a non-transitory computer-readable storage medium. Specific examples include, but are not limited to: a magnetic storage device, such as a magnetic tape or a hard disk (HDD); an optical storage device, such as a compact disc (CD-ROM); a memory, such as a random access memory (RAM) or a flash memory.

The computer-readable storage medium 2420 may contain a program 2421. The program 2421 may contain code/computer-executable instructions that, when executed by the processor 2410, cause the processor 2410 to perform the method according to the embodiments of the present disclosure or any modification thereof. For example, in an exemplary embodiment, the code in the program 2421 may contain one or more program modules, such as 2421A, 2421B, . . . .

In an embodiment, the display device 2400 may be any product or component with a display function and a camera function, such as a TV, a display, a digital photo frame, a mobile phone, a smart watch, and a tablet computer.

Although the present disclosure has been described with reference to the drawings, the embodiments disclosed in the drawings are intended to exemplify the embodiments of the present disclosure, and should not be understood as a limitation of the present disclosure. Size rates in the drawings are only schematic and should not be construed as limiting the present disclosure.

The embodiments described above merely illustrate the principle and structure of the present disclosure, but are not used to limit the present disclosure. Those skilled in the art should understand that any changes and improvements made to the present disclosure without departing from the general idea of the present disclosure fall within the scope of the present disclosure. The protection scope of the present disclosure shall be determined by the scope defined by the claims of the present disclosure.

What is claimed is:

1. A display substrate, comprising:
   a base substrate;
   a color filter layer arranged on the base substrate, wherein the color filter layer comprises a plurality of sub-color filters comprising at least a first primary color sub-color filter, a second primary color sub-color filter and a third primary color sub-color filter, the first primary color, the second primary color and the third primary color are different from each other; and
   a monochromatic filter layer arranged on a side of the color filter layer away from the base substrate, wherein the monochromatic filter layer is formed as a filter layer with a fourth primary color, one of the first primary color, the second primary color and the third primary color is the same as the fourth primary color, or the first primary color, the second primary color, the third primary color and the fourth primary color are different from each other,
   wherein at least one of an orthographic projection of the first primary color sub-color filter on the base substrate, an orthographic projection of the second primary color sub-color filter on the base substrate and an orthographic projection of the third primary color sub-color filter on the base substrate at least partially overlaps an orthographic projection of the monochromatic filter layer on the base substrate;
   wherein the display substrate further comprises at least one of a first cover layer arranged between the color filter layer and the monochromatic filter layer and a second cover layer arranged on a side of the monochromatic filter layer away from the base substrate,
   wherein the display substrate further comprises:
   a metal light-shielding layer arranged on the side of the monochromatic filter layer away from the base substrate, wherein at least one of the orthographic projection of the first primary color sub-color filter on the base substrate, the orthographic projection of the second primary color sub-color filter on the base substrate and the orthographic projection of the third primary color sub-color filter on the base substrate at least partially overlaps the orthographic projection of the monochromatic filter layer on the base substrate so as to form an overlapping region on the base substrate, and an orthographic projection of the metal light-shielding layer on the base substrate is at least partially located in the overlapping region; and
   wherein an orthographic projection of the second cover layer on the base substrate does not overlap the orthographic projection of the metal light-shielding layer on the base substrate.

2. The display substrate of claim 1, wherein the fourth primary color is the same as the first primary color.

3. The display substrate of claim 1, wherein each of the orthographic projection of the second primary color sub-color filter on the base substrate and the orthographic projection of the third primary color sub-color filter on the base substrate at least partially overlaps the orthographic projection of the monochromatic filter layer on the base substrate.

4. The display substrate of claim 1, wherein the monochromatic filter layer comprises a first opening exposing a part of the second primary color sub-color filter and a second opening exposing a part of the third primary color sub-color filter; and
   wherein an orthographic projection of the first opening on the base substrate has an area greater than that of an orthographic projection of the second opening on the base substrate.

5. The display substrate of claim 1, wherein the orthographic projection of the first primary color sub-color filter on the base substrate at least partially overlaps the orthographic projection of the monochromatic filter layer on the base substrate; or
   wherein an orthographic projection of an overlapping region of the first primary color sub-color filter and the monochromatic filter layer on the base substrate has an area less than or equal to that of the orthographic projection of the first primary color sub-color filter on the base substrate; or wherein the orthographic projection of the first primary color sub-color filter on the base substrate does not overlap the orthographic projection of the monochromatic filter layer on the base substrate.

6. The display substrate of claim 1, wherein the first primary color is red, the second primary color is green, and the third primary color is blue.

7. The display substrate of claim 1, wherein orthographic projections of two at least partially adjacent sub-color filters of the plurality of sub-color filters on the base substrate at least partially overlap each other.

8. The display substrate of claim 1, further comprising:
a driving circuit layer arranged on the base substrate;
a light emitting device arranged on a side of the driving circuit layer away from the base substrate; and
an encapsulation layer arranged on a side of the light emitting device away from the base substrate, wherein the color filter layer is arranged on a surface of the encapsulation layer away from the base substrate.

9. The display substrate of claim 1, wherein the metal light-shielding layer comprises at least one of a metal light-absorbing layer or a metal light-reflecting layer.

10. A display device comprising the display substrate of claim 1.

11. A method of manufacturing a display substrate, comprising:
forming a base substrate;
forming a color filter layer on the base substrate, wherein the color filter layer comprises a plurality of sub-color filters comprising at least a first primary color sub-color filter, a second primary color sub-color filter and a third primary color sub-color filter, the first primary color, the second primary color and the third primary color are different from each other; and
forming a monochromatic filter layer on a side of the color filter layer away from the base substrate, wherein the monochromatic filter layer is formed as a filter layer with a fourth primary color, one of the first primary color, the second primary color and the third primary color is the same as the fourth primary color, or the first primary color, the second primary color, the third primary color and the fourth primary color are different from each other, and wherein at least one of an orthographic projection of the first primary color sub-color filter on the base substrate, an orthographic projection of the second primary color sub-color filter on the base substrate and an orthographic projection of the third primary color sub-color filter on the base substrate at least partially overlaps an orthographic projection of the monochromatic filter layer on the base substrate;
wherein the method further comprises:
forming a first photoresist layer on the monochromatic filter layer;
forming a concave region at a pattern on the first photoresist layer based on a mask reticle with the pattern;
forming a metal light-shielding layer on the first photoresist layer comprising the concave region;
forming a second photoresist layer on the metal light-shielding layer, wherein the first photoresist layer has a photosensitivity opposite to that of the second photoresist layer;
forming a mask with the pattern on the second photoresist layer based on the mask reticle; and
forming a metal light-shielding layer with the pattern by using the mask.

12. The method of claim 11, further comprising:
forming a first cover layer on the color filter layer subsequent to forming the color filter layer on the base substrate, wherein the monochromatic filter layer is formed on the first cover layer; and/or
forming a second cover layer on the monochromatic filter layer subsequent to forming the monochromatic filter layer on the color filter layer; and/or
adjusting an opening rate of at least part of the plurality of sub-color filters by adjusting an opening rate of the monochromatic filter layer.

* * * * *